CONNECTION OF SEMICONDUCTOR ELEMENTS TO THIN FILM CIRCUITS USING FOIL RIBBON
Filed Oct. 9, 1962
FIG. 1 TRANSISTORS ON Au RIBBON
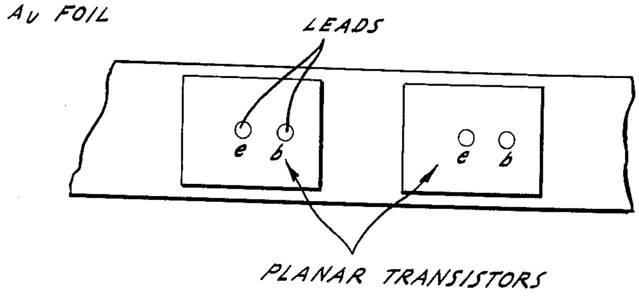
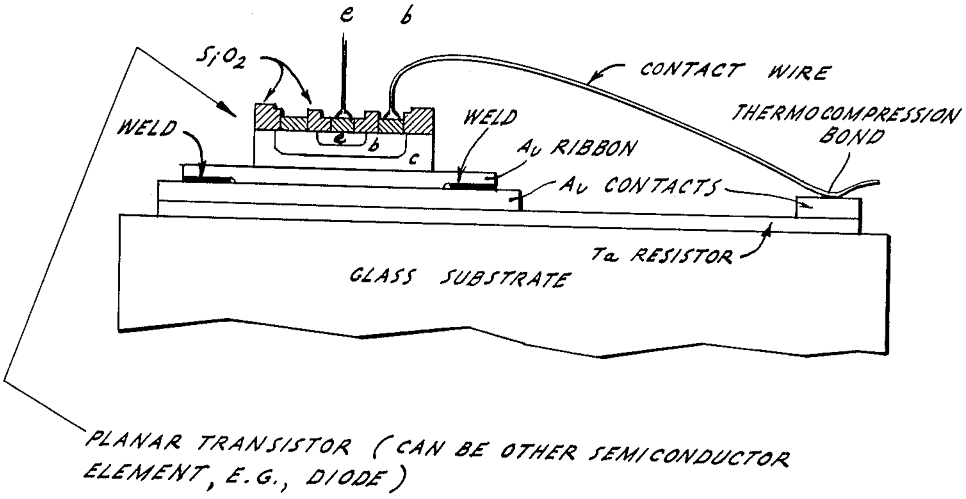
FIG. 2. SECTION OF TRANSISTOR BONDED TO THIN FILM PASSIVE CIRCUIT. (VERTICAL DIMENSIONS GREATLY EXAGGERATED)
INVENTORS
JOHN A. HALL, JR.
THOMAS V. SIKINA
BY
Allen V. Hazeltine
ATTORNEY 3,235,945

CONNECTION OF SEMICONDUCTOR ELEMENTS TO THIN FILM CIRCUITS USING FOIL RIBBON

John Alexander Hall, Jr., Warminster, and Thomas V. Sikina, Willow Grove, Pa., assignors to Philco Corporation, Philadelphia, Pa., a corporation of Delaware Filed Oct. 9, 1962, Ser. No. 229,329
10 Claims. (Cl. 29—155.5)

SUMMARY

In the present invention active semiconductor elements are connected to thin film circuit plates using a novel and improved approach. The semiconductor elements are bonded to a foil strip, preferable gold doped with an impurity, and overlapping edges of the strip are welded, preferably ultrasonically, to the contact lands on the circuit plate.

INTRODUCTION

With the micro-miniaturization of active and passive electronic circuitry has come a concomitant need for a cheap, reliable, and simple method of connecting (both physically and electrically) the active to the passive elements. This need is particularly keen with microcircuit units such as gates, flip-flops, and linear circuits which are amenable to mass production.

Thin films of gold and tantalum, when deposited on substrates, and photolithographically etched and selectively anodized have proved to make excellent resistance-capacitance (RC) circuits, as discussed in the copending application of Francis J. Murray, Jr., and Thomas V. Sikina, Serial No. 232,539, filed October 23, 1962, and assigned to the assignee of the present invention. Various semiconductor elements, such as the silicon planar transistor and the junction diode, are currently being fabricated to occupy approximately the same area as the above mentioned thin film circuits. Thus the desirability of directly bonding the semiconductor elements to the passive circuits without interconnecting leads is manifest.

Prior techniques for effecting such bonding (such as soft soldering or the silver paste technique) were generally slow, costly, and not entirely reliable. Furthermore the heat used often adversely affected the electronic elements. The method of inserting the active elements into holes in the substrate, discussed in an article by Maissel et al. at page 76 of the IRE Transactions on Component Parts, June 1961, is likewise costly and relatively complex.

The instant method of bonding has been proven to be cheap and reliable and it is inherently adaptable to mass production.

DRAWING

Structures relevant to the process of the invention are depicted in the drawing wherein:

FIG. 1 shows semiconductor elements on a conductive ribbon, and

FIG. 2 shows a section of a semiconductor element to passive circuit weld according to the invention.

*FIG. 1.—Transistors on ribbon*

It has been found highly convenient, in order to handle semiconductor elements as well as mount them in accordance with the invention, to fabricate a ribbon with the elements bonded thereto at spaced intervals as shown in FIG. 1. Surface passivated planar transistors have been shown as the semiconductor elements for exemplary purposes, but any other semiconductor elements, such as diodes, may be used instead.

Because of its low resistance and ease of handling, gold has been used as the ribbon metal, but many other malleable metals or alloys can be used alternatively. The ribbon metal is suitably doped to provide a highly conductive ohmic contact to the semiconductor device. If the surface of the device in contact with the ribbon is N-type material (e.g., an NPN transistor or a PN diode), the ribbon may be doped with phosphorous, arsenic, or antimony; if a P-type surface (e.g., a PNP transistor) is used the ribbon may be doped with aluminum, gallium, or indium. When epitaxial devices or planar-type transistors which have all electrodes affixed to their upper surface are used, no dopant is necessary.

A satisfactory thickness for the ribbon has been found to be approximately 2 mils; its width is chosen according to the width of the semiconductor device, but may be slightly narrower or wider. The elements may desirably be spaced apart on the ribbon at distances corresponding to the contact areas on the microcircuit substrate.

The semiconductor elements may be bonded to gold by heating both until the eutectic of silicon and gold is reached. Alternatively, bonding may be achieved by use of a doped solder preform which is placed between semiconductor and ribbon and then fused.

As will be discussed, the ribbon of semiconductor elements of FIG. 1 is extremely useful in the fabrication of circuits according to the process of the invention. The ribbon is useful in its own right, however, since it can be rolled to make a convenient package for shipping semiconductor elements. On receipt the ribbon may be cut to yield single or plural transistor-ribbon assemblies as desired.

*FIG. 2.—Active element to passive circuit connection*

A semiconductor element with an attached segment of ribbon which protrudes from the semiconductor element at opposite ends thereof is bonded to a contact land on a thin film circuit as shown in FIG. 2. The extended edges of the ribbon are desirably welded to the contact area ultrasonically, e.g., with a Sonowelding machine (currently supplied by Aeroprojects, Inc., West Chester, Pa.). Ultrasonic welding permits rapid connections to be made at room temperature with no detectable change in electrical characteristics of either the active or passive components. The resultant connections are formed without the use of any flux and are capable of being cycled over a broad temperature range (liquid nitrogen to 200° C.) without injury. Other methods of bonding the ribbon to the contact land (e.g., spot welding, thermo-compression bonding, soldering, etc.) may be used in lieu of ultrasonic welding, however.

The passivated planar transistor of FIG. 2 is shown for exemplary purposes only—any type semiconductor may be connected to the thin-film circuit in the manner shown. Similarly the particular materials shown as part of the thin-film circuit (Ta and Au) are by no means essential since it is known that a wide variety of metals can be used in lieu of those shown. The thin film circuit has been depicted only as a resistor with contacts, but more complex RC circuits similar to those of the above mentioned Murray-Sikina application are compatible with the instant process.

If a ribbon of devices as shown in FIG. 1 is used, multiple semiconductor devices can be attached in one operation to a passive thin film circuit when the collectors are to be connected in common. The ribbon of devices also facilitates automatic assembly when similar but unconnected circuits are to be constructed.

After the semiconductor device is attached to the passive circuit the desired upper contacts may be made by thermocompression bonding a gold or aluminum ribbon or wire of small diameter to the semiconductor device and a contact land as shown. Further details concerning thin film and microminiature circuit techniques can be gleaned by reference to the above-cited Maissel et al. article which begins at page 70, op. cit.

Although many specificities of the invention have been discussed, these are nowise to be considered limiting or indicative of the scope of the invention. The invention is defined only by the language of the appended claims.

We claim:

1. A method of interconnecting a semiconductor element having at least one substantially flat surface and a thin film passive circuit having at least one flat contact land comprising the steps of:

(a) bonding one face of a metallic ribbon to the flat surface of said semiconductor element so that segments of the ribbon protrude beyond edges of said surface, and (b) placing the other face of said ribbon adjacent said land contact area and bonding the extending segments thereof to said land contact by ultrasonic welding.

2. The method of claim 1 wherein said semiconductor is a transistor.

3. The method of claim 1 wherein said semiconductor is a diode.

4. The method of claim 1 wherein said ribbon is doped with a dopant selected from the group consisting of phosphorous, arsenic, and antimony.

5. The method of claim 1 wherein said ribbon is doped with a dopant selected from the group consisting of aluminum gallium, and indium.

6. The method of claim 1 wherein said ribbon is comprised of gold.

7. The method of claim 5 wherein said ribbon is comprised of gold.

8. A method of fabricating thin film circuits comprising the following steps:

(a) placing the collector surface of a passivated planar transistor in contact with a segment of doped gold foil ribbon longer than the largest dimension of said collector surface and heating the junction formed to a temperature greater than the eutectic of silicon-gold, whereby a bond is made between said gold foil and said transistor, (b) placing the face of said gold ribbon which is not in contact with said transistor adjacent a gold contact land on a tantalum-gold thin film circuit and ultrasonically welding at least two extending surfaces of said ribbon to said land, and (c) thermocompression bonding one end of a contact wire to at least one exposed junction area on the surface of said transistor and bonding the other end of said contact wire to another gold contact land of said film circuit.

9. The method of claim 8 wherein said transistor is comprised of silicon.

10. The method of claim 8 wherein said transistor is comprised of germanium.

References Cited by the Examiner

UNITED STATES PATENTS

| | | | |
|---|---|---|---|
| 2,757,324 | 7/1956 | Pearson | 219—85 XR |
| 2,946,119 | 7/1960 | Jones | 29—497.5 XR |
| 2,978,612 | 4/1961 | Lutton | 29—155.5 XR |
| 2,987,597 | 6/1961 | McCotter | 219—85 XR |
| 3,010,057 | 11/1961 | Albert | 29—155.5 XR |
| 3,020,454 | 2/1962 | Dixon | 29—470.1 XR |
| 3,034,198 | 5/1962 | Rayburn et al. | 29—155.5 XR |
| 3,078,559 | 2/1963 | Thomas | 29—155.5 XR |
| 3,087,239 | 4/1963 | Clagett | 29—498 XR |
| 3,138,743 | 6/1964 | Kilby. | |
| 3,151,278 | 9/1964 | Elarde | 29—155.5 XR |

OTHER REFERENCES

RCA TN No. 320, November 1959.

IBM Technical Disclosure Bulletin, vol. 1, No. 5, February 1959.

JOHN F. CAMPBELL, *Primary Examiner.*